(12) United States Patent
Takishita et al.

(10) Patent No.: US 10,755,933 B2
(45) Date of Patent: Aug. 25, 2020

(54) METHOD OF MANUFACTURING SEMICONDUCTOR DEVICE

(71) Applicant: FUJI ELECTRIC CO., LTD., Kawasaki-shi, Kanagawa (JP)

(72) Inventors: Hiroshi Takishita, Matsumoto (JP); Takashi Yoshimura, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/278,878

(22) Filed: Feb. 19, 2019

(65) Prior Publication Data

US 2019/0181008 A1 Jun. 13, 2019

Related U.S. Application Data

(63) Continuation of application No. PCT/JP2018/003054, filed on Jan. 30, 2018.

(30) Foreign Application Priority Data

Mar. 29, 2017 (JP) .................................. 2017-066402

(51) Int. Cl.
*H01L 21/268* (2006.01)
*H01L 29/739* (2006.01)
(Continued)

(52) U.S. Cl.
CPC .......... *H01L 21/268* (2013.01); *H01L 21/265* (2013.01); *H01L 21/266* (2013.01);
(Continued)

(58) Field of Classification Search
CPC ... H01L 21/268; H01L 21/265; H01L 29/739; H01L 29/083; H01L 21/266;
(Continued)

(56) References Cited

U.S. PATENT DOCUMENTS 6,287,925 B1 * 9/2001 Yu ..................... H01L 21/26513
438/301
2009/0184340 A1 7/2009 Nemoto et al.
(Continued)

FOREIGN PATENT DOCUMENTS

JP 2004-039984 A 2/2004
JP 2009-176892 A 8/2009
(Continued)

OTHER PUBLICATIONS

Kato et al. (JP 2016-046480 A, English machine translation) (Year: 2016).*

*Primary Examiner* — Mohammed R Alam
(74) *Attorney, Agent, or Firm* — Rabin & Berdo, P.C.

(57) ABSTRACT

Laser light of a short-wavelength laser is irradiated from a rear surface of an n⁻-type semiconductor substrate, activating a p⁺-type collector region and an n⁺-type cathode region. At this time, a surface layer at the rear surface of the n⁻-type semiconductor substrate is melted and recrystallized, eliminating amorphous parts. Thereafter, laser light of a long-wavelength laser is irradiated from the rear surface of the n⁻-type semiconductor substrate and an n-type FS region is activated. Substantially no amorphous parts exist in the surface layer at the rear surface of the n⁻-type semiconductor substrate. Therefore, decreases in the absorption rate and increases in the reflection rate of the laser light of the long-wavelength laser are suppressed and heat from the laser light of the long-wavelength laser is transmitted to the n-type FS region, enabling the n-type FS region to be assuredly activated by laser annealing using lower energy.

9 Claims, 11 Drawing Sheets

(51) Int. Cl.
  *H01L 29/66* (2006.01)
  *H01L 27/07* (2006.01)
  *H01L 29/08* (2006.01)
  *H01L 21/266* (2006.01)
  *H01L 21/265* (2006.01)

(52) U.S. Cl.
  CPC ........ *H01L 27/0716* (2013.01); *H01L 29/083* (2013.01); *H01L 29/0821* (2013.01); *H01L 29/66348* (2013.01); *H01L 29/739* (2013.01); *H01L 29/7397* (2013.01); *H01L 27/0727* (2013.01)

(58) Field of Classification Search
  CPC ............ H01L 29/0821; H01L 27/0716; H01L 29/66348; H01L 29/7397; H01L 27/0727; H01L 29/0834; H01L 29/36; H01L 29/1095; H01L 29/7396; H01L 29/407; H01L 21/263; H01L 29/32
  See application file for complete search history.

(56) References Cited

U.S. PATENT DOCUMENTS

| | | |
|---|---|---|
| 2012/0064706 A1 | 3/2012 | Nemoto et al. |
| 2015/0170918 A1 | 6/2015 | Wakabayashi |
| 2017/0373141 A1 | 12/2017 | Yoshida et al. |

FOREIGN PATENT DOCUMENTS

| | | |
|---|---|---|
| JP | 2010-171057 A | 8/2010 |
| JP | 2010283325 A | 12/2010 |
| JP | 2013-065790 A | 4/2013 |
| JP | 2013-247248 A | 12/2013 |
| JP | 2014-036110 A | 2/2014 |
| JP | 2016-046480 A | 4/2016 |
| JP | 2017-011000 A | 1/2017 |

\* cited by examiner

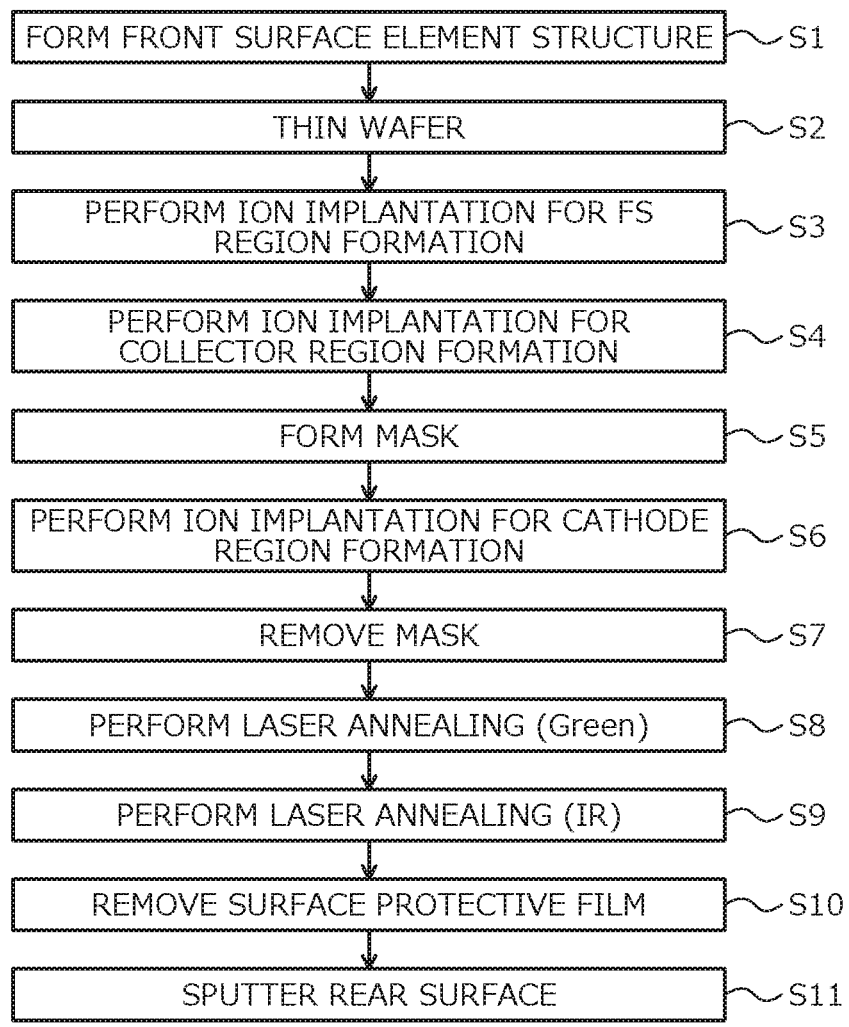

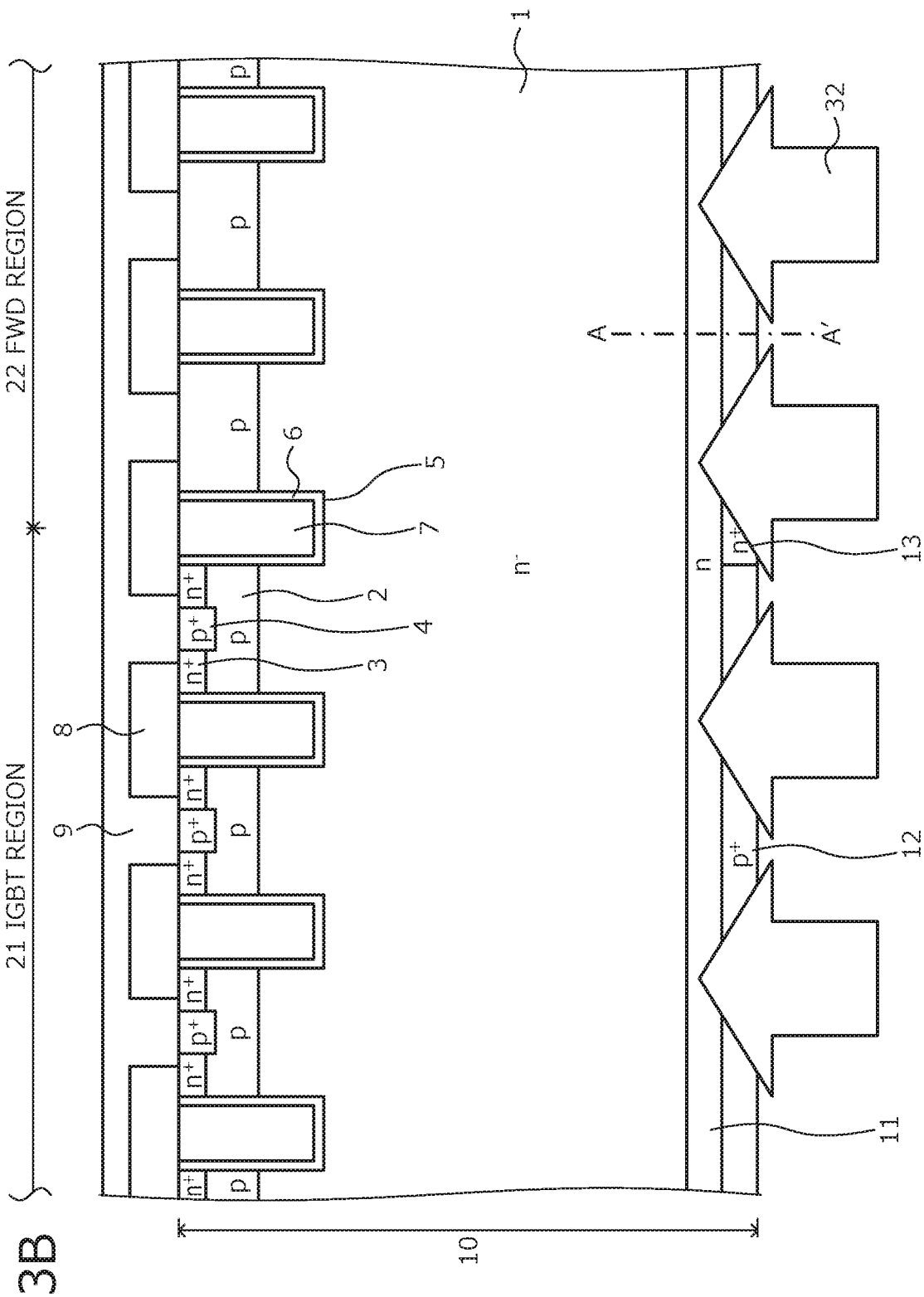

METHOD OF MANUFACTURING SEMICONDUCTOR DEVICE

CROSS REFERENCE TO RELATED APPLICATIONS

This is a continuation application of International Application PCT/JP2018/003054 filed on Jan. 30, 2018 which claims priority from a Japanese Patent Application No. 2017-066402 filed on Mar. 29, 2017, the contents of which are incorporated herein by reference.

BACKGROUND OF THE INVENTION

1. Field of the Invention

Embodiments of the invention relate to a method of manufacturing a semiconductor device.

2. Description of the Related Art

Conventionally, as one method of activating a region that is deep from a main surface of a semiconductor substrate (semiconductor wafer) by laser annealing, a method of using a long-wavelength laser such as an infrared (IR) laser, for example, having a relatively long wavelength may be given as an example. As the wavelength of the used laser increases, penetration depth of laser light increases, whereby the laser light reaches deeper regions of the semiconductor substrate. Therefore, use of a long-wavelength laser enables activation of a region deeper than that in a case where a short-wavelength laser such as a green laser, for example, having a relatively short wavelength is used.

Further, a method of activating a region relatively deep from a main surface of a semiconductor substrate by using a long-wavelength laser and thereafter, activating a region relatively shallow from the same main surface of the semiconductor substrate by using a short-wavelength laser is known as another method of activating a predetermined region by laser annealing. The region that is relatively deep from the main surface of the semiconductor substrate, for example, is a field stop (FS) region. The region that is relatively shallow from the main surface of the semiconductor substrate, for example, is a collector region or a cathode region.

Conventional laser annealing using lasers of two different wavelengths will be described taking, as an example, a case in which a reverse-conducting insulated-gate bipolar transistor (RC-IGBT) is fabricated (manufactured). FIGS. 10A and 10B are cross-sectional views of a conventional semiconductor device during manufacture. Herein, an IR laser is used as a long-wavelength laser while a green laser is used as a short-wavelength laser.

First, as depicted in FIG. 10A, on a front surface side of an n$^-$type semiconductor substrate 110 constituting an n$^-$-type drift region 101, a front electrode 109 and front-surface element structures of the RC-IGBT are formed. The front-surface element structures of the RC-IGBT include a MOS gate of an IGBT disposed in an IGBT region 121 and a p-type anode region of a free wheeling diode (FWD) disposed in a FWD region 122. The IGBT region 121 and the FWD region 122 are disposed in parallel on the single semiconductor substrate 110.

The MOS gate of the IGBT is constituted by a p-type base region 102, an n$^+$-type emitter region 103, a p$^+$-type contact region 104, a trench 105, a gate insulating film 106, and a gate electrode 107. The p-type base region 102 serves as the p-type anode region of the FWD. The front electrode 109 serves as an emitter electrode and an anode electrode. Next, under conditions different from those for a rear surface of the semiconductor substrate 110, ion implantation is performed plural times, respectively forming an n-type FS region 111, a p$^+$-type collector region 112, and an n$^+$-type cathode region 113.

Next, a laser light 131 of an IR laser is irradiated on the n-type FS region 111 that is relatively deep from the rear surface of the semiconductor substrate 110, activating the n-type FS region 111. Next, as depicted in FIG. 10B, a laser light 132 of a green laser is irradiated on the p$^+$-type collector region 112 and the n$^+$-type cathode region 113 that are relatively shallow from the rear surface of the semiconductor substrate 110, activating the p$^+$-type collector region 112 and the n$^+$-type cathode region 113. Thereafter, a rear electrode (not depicted) is formed on the rear surface of the semiconductor substrate 110, whereby the RC-IGBT is completed.

According to a method proposed as another method of activating a predetermined region by laser annealing, while a first laser light irradiated from a semiconductor laser oscillator is continuously irradiated on a semiconductor substrate, a second laser light irradiated from a solid-state laser oscillator is irradiated on the same main surface of the semiconductor substrate (for example, refer to Japanese Laid-Open Patent Publication No. 2014-036110 (paragraphs 0011, 0022)). In Japanese Laid-Open Patent Publication No. 2014-036110, a wavelength of the first laser light is 950 nm or less, while a wavelength of the second laser light is a wavelength range of green, regions irradiated with the first and the second laser lights substantially overlap each other.

Further, according to another method proposed as a method of activating a predetermined region by laser annealing, with respect to an ion implantation surface of a semiconductor substrate, YAG2ω laser (YAG (Yttrium Aluminum Garnet second harmonic generation) laser, wavelength: 500 nm) and a gallium arsenide (GaAs) based semiconductor laser (wavelength: 808 nm) are irradiated concurrently (for example, refer to Japanese Laid-Open Patent Publication No. 2009-176892 (paragraph 0057)). In Japanese Laid-Open Patent Publication No. 2009-176892, laser light of two types of lasers of differing wavelengths are irradiated concurrently, and without adversely affecting a MOS gate at the substrate front surface, a predetermined region is formed at a position deep from the rear surface of the semiconductor substrate.

SUMMARY OF THE INVENTION

According to an embodiment of the present invention, a method of manufacturing a semiconductor device includes ion implanting an impurity from one main surface of a semiconductor substrate and forming a first semiconductor region; ion implanting an impurity from the one main surface of the semiconductor substrate, and forming in a region shallower than the first semiconductor region, a second semiconductor region having an impurity concentration that is higher than that of the first semiconductor region; irradiating a first laser light from the one main surface of the semiconductor substrate and activating the second semiconductor region, and melting and recrystallizing a surface layer at the one main surface of the semiconductor substrate; and irradiating a second laser light from the one main surface of the semiconductor substrate and activating first semiconductor region, after the third process, the second laser light having a wavelength longer than that of the first laser light.

In the embodiment, in irradiating the first laser light, energy of the first laser light is 1 J/cm$^2$ to 2 J/cm$^2$.

In the embodiment, in irradiating the second laser light, energy of the second laser light is 4 J/cm$^2$ to 8 J/cm$^2$.

In the embodiment, in irradiating the first laser light, a depth of impurity activation by the first laser light is less than 1 μm.

In the embodiment, in irradiating the second laser light, a depth of impurity activation by the second laser light is 1 μm to 4 μm.

In the embodiment, a wavelength of the first laser light is 500 nm to 550 nm.

In the embodiment, a wavelength of the second laser light is 800 nm or more.

In the embodiment, the method further includes forming a predetermined element structure on another main surface side of the semiconductor substrate of a first conductivity type; and ion implanting an impurity of a second conductivity type from the one main surface of the semiconductor substrate, before the third process, and forming in a region shallower than the first semiconductor region, a third semiconductor region of the second conductivity type disposed in parallel with the second semiconductor region in a direction parallel to the one main surface of the semiconductor substrate. In forming the first semiconductor region, an impurity of the first conductivity type is ion implanted from the one main surface of the semiconductor substrate and the first semiconductor region of the first conductivity type is formed. In forming the second semiconductor region, an impurity of the first conductivity type is ion implanted from the one main surface of the semiconductor substrate and the second semiconductor region of the first conductivity type is formed. In irradiating the first laser light, the first laser light is irradiated and the second semiconductor region and the third semiconductor region are activated.

In the embodiment, in forming the first semiconductor region, a dose amount of ion implantation is 5×10$^{11}$/cm$^2$ to 1×10$^{14}$/cm$^2$.

In the embodiment, in forming the second semiconductor region, a dose amount of ion implantation is 1×10$^{14}$/cm$^2$ to 1×10$^{16}$/cm$^2$.

In the embodiment, in forming the third semiconductor region, a dose amount of ion implantation is 1×10$^{12}$/cm$^2$ to 1×10$^{15}$/cm$^2$.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is a flowchart of an outline of the method of manufacturing the semiconductor device according to the embodiment;

FIG. 3B is a cross-sectional view the semiconductor device according to the embodiment during manufacture;

DETAILED DESCRIPTION OF THE INVENTION

Figure 8:
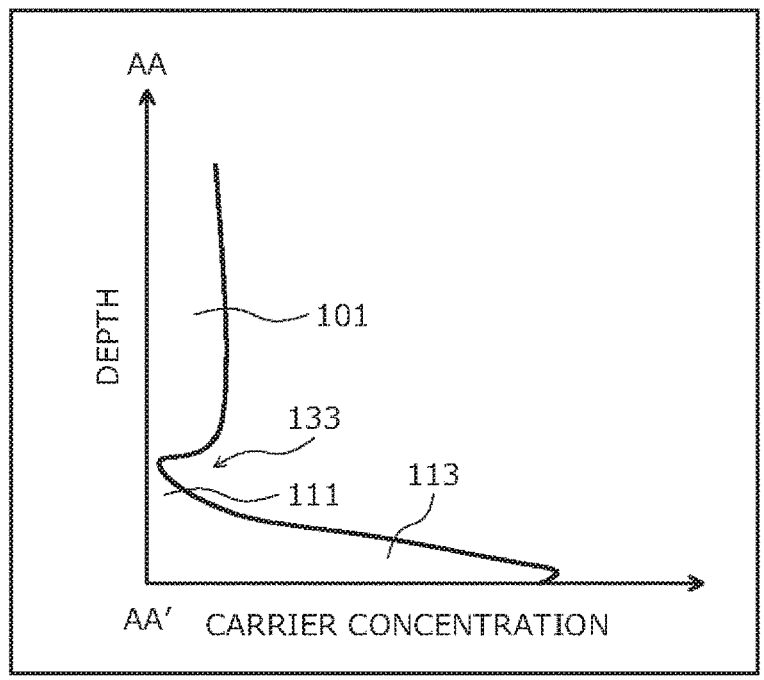
FIG. 8 is a characteristics diagram depicting carrier concentration distribution after laser annealing in the conventional semiconductor device.
Figure 9:
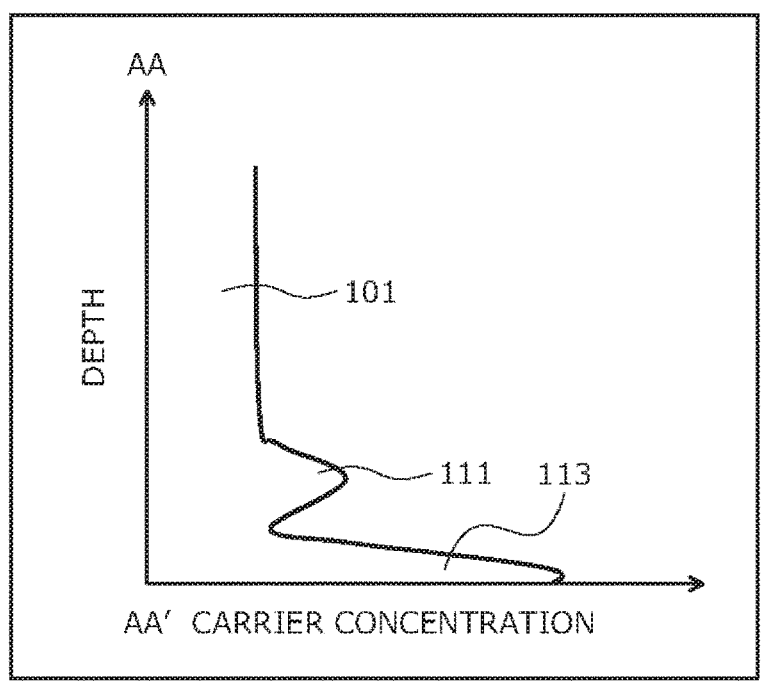
FIG. 9 is a characteristics diagram depicting carrier concentration distribution after laser annealing in the conventional semiconductor device.
Figure 10A:
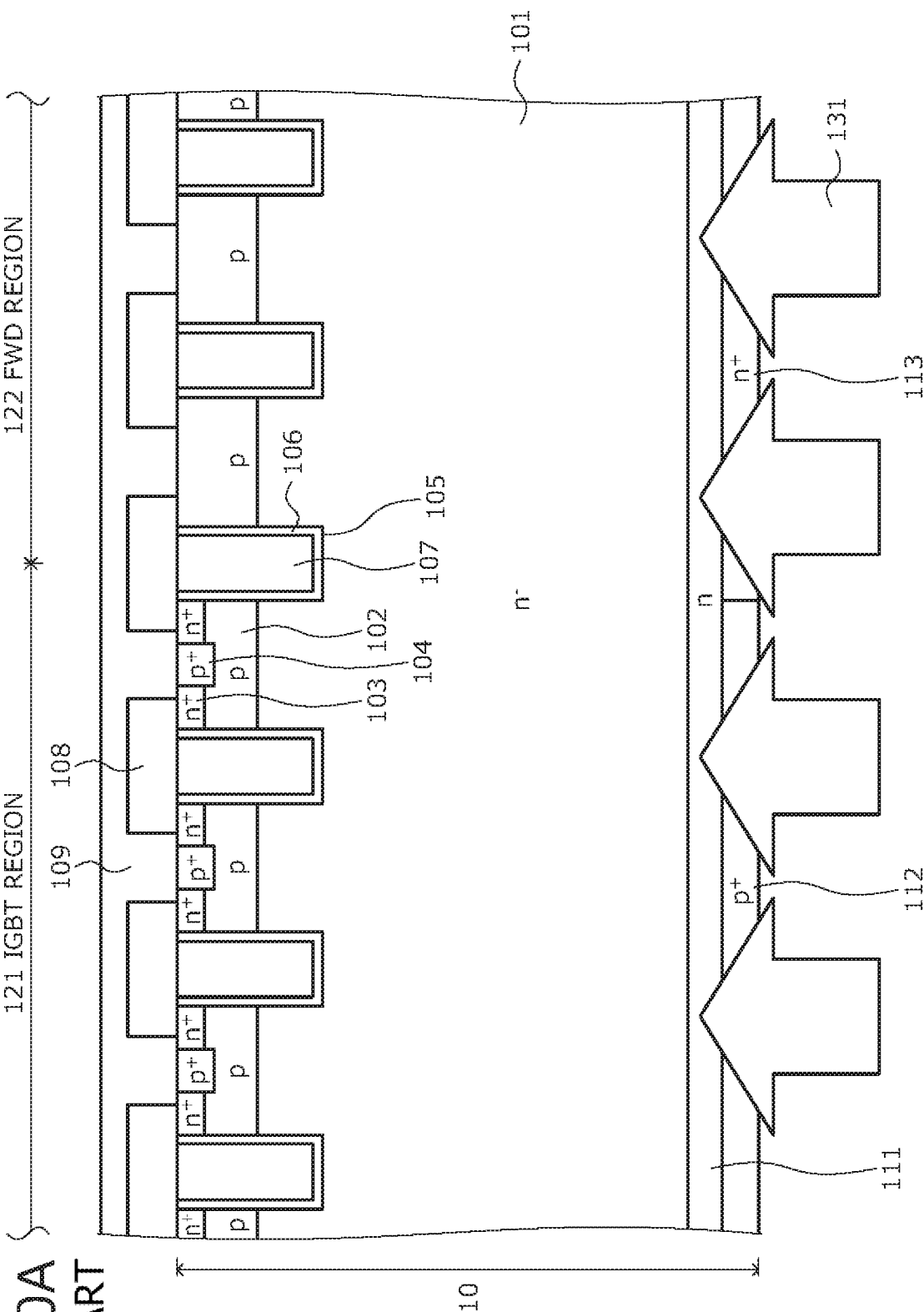
FIG. 10A is a cross-sectional view of the conventional semiconductor device during manufacture.
Figure 10B:
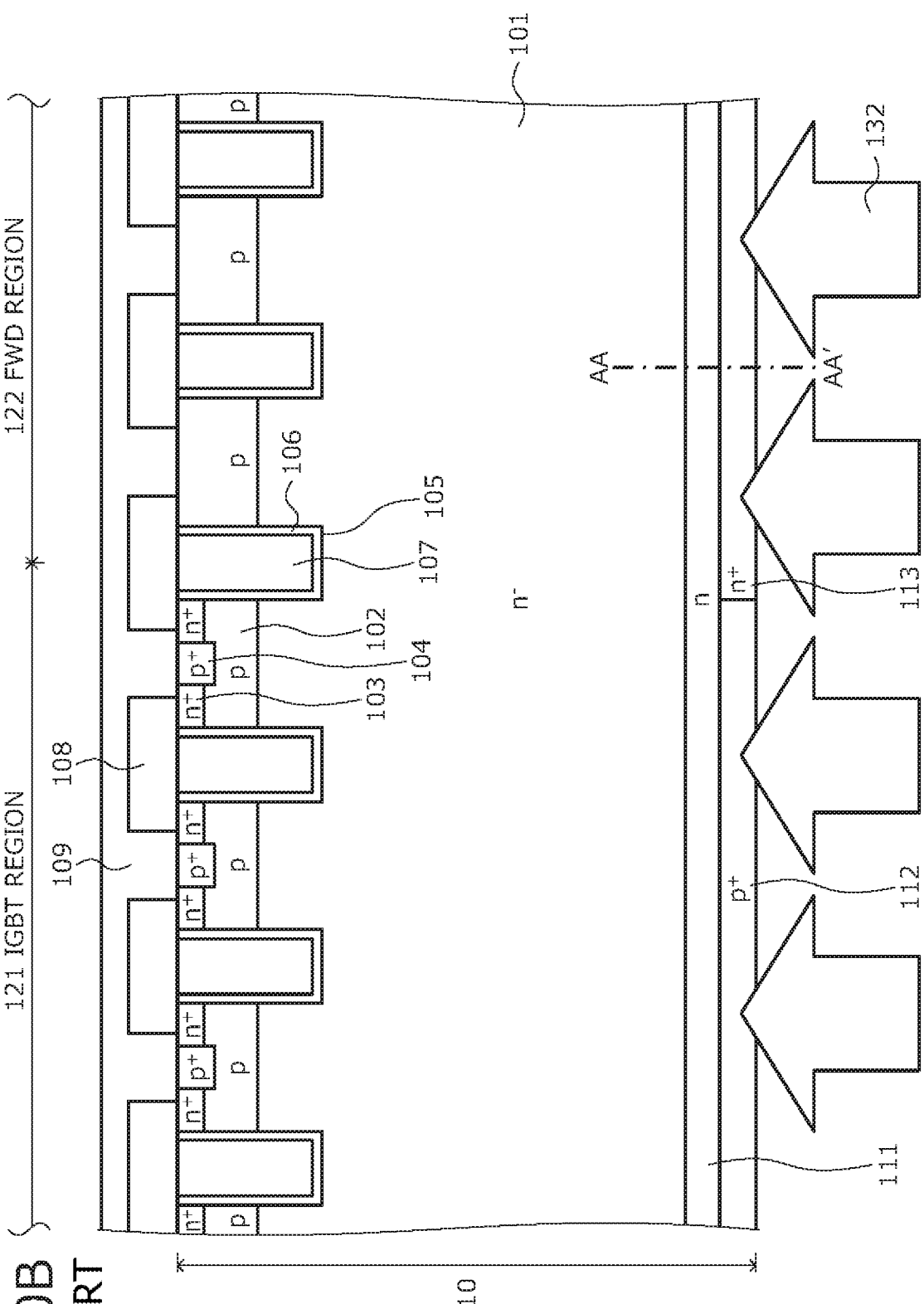
FIG. 10B is a cross-sectional view of the conventional semiconductor device during manufacture.

First, problems associated with the related arts will be described. In the conventional laser annealing (refer to FIGS. 10A and 10B), the following problem arises. FIGS. 8 and 9 are characteristics diagrams depicting carrier concentration distribution after laser annealing in the conventional semiconductor device. In FIGS. 8 and 9, carrier concentration distribution at cutting line AA-AA' in FIG. 10B is depicted. In forming the n$^+$-type cathode region 113 in the FWD region 122, although ion implantation has to be performed at a high dose amount from the rear surface of the semiconductor substrate 110, when ion implantation is performed at a high dose amount, crystallinity of a surface layer at the rear surface of the semiconductor substrate 110 collapses, resulting in an amorphous state. The laser light 131 of a long-wavelength laser is irradiated on a region deeper than the amorphous region.

When the laser light 131 of the long-wavelength laser is irradiated on the amorphous region and the region deeper than the amorphous region, an absorption rate of the laser light 131 decreases or a reflection rate of the laser light 131 increases. As a result, heat is not transmitted to a region deeper than the amorphous region from the rear surface of the semiconductor substrate 110, and as depicted in FIG. 8, a predetermined region (herein, the n-type FS region 111) is difficult to activate. Therefore, carrier concentration of the n-type FS region 111 becomes lower than carrier concentration of the n$^-$-type drift region 101, and a predetermined carrier concentration of the n-type FS region 111 is not obtained.

This problem is solved by irradiating the laser light 131 of the long-wavelength laser by a higher energy (for example, about 5.8 J/cm$^2$ or more). In other words, as depicted in FIG. 9, the n-type FS region 111 is activated by the high-energy laser light 131 and the carrier concentration of the n-type FS region 111 becomes higher than the carrier concentration of the n$^-$-type drift region 101. However, as the energy by which the laser light 131 of the long-wavelength laser is irradiated increases, the rear surface of the semiconductor substrate 110 reaches a high temperature and generates heat.

In Japanese Laid-Open Patent Publication Nos. 2014-036110 and 2009-176892 as well, the laser light of two types of lasers of differing wavelengths are irradiated concurrently onto the same region, from one main surface of the semiconductor substrate and therefore, the rear surface of the semiconductor substrate reaches a high temperature and generates heat. In particular, a surface temperature of the rear surface of the semiconductor substrate, for example, rises to about 200 degrees C. to 300 degrees C. and therefore, for example, the surface layer at the front surface of the semiconductor substrate 110 degrades, and pattern formation (resist burning) of a resist film covering the front surface of the semiconductor substrate 110, deformation, foam-adhesive residue of the adhesive tape, etc., adversely affect components on the front surface side of the semiconductor substrate 110.

Embodiments of a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
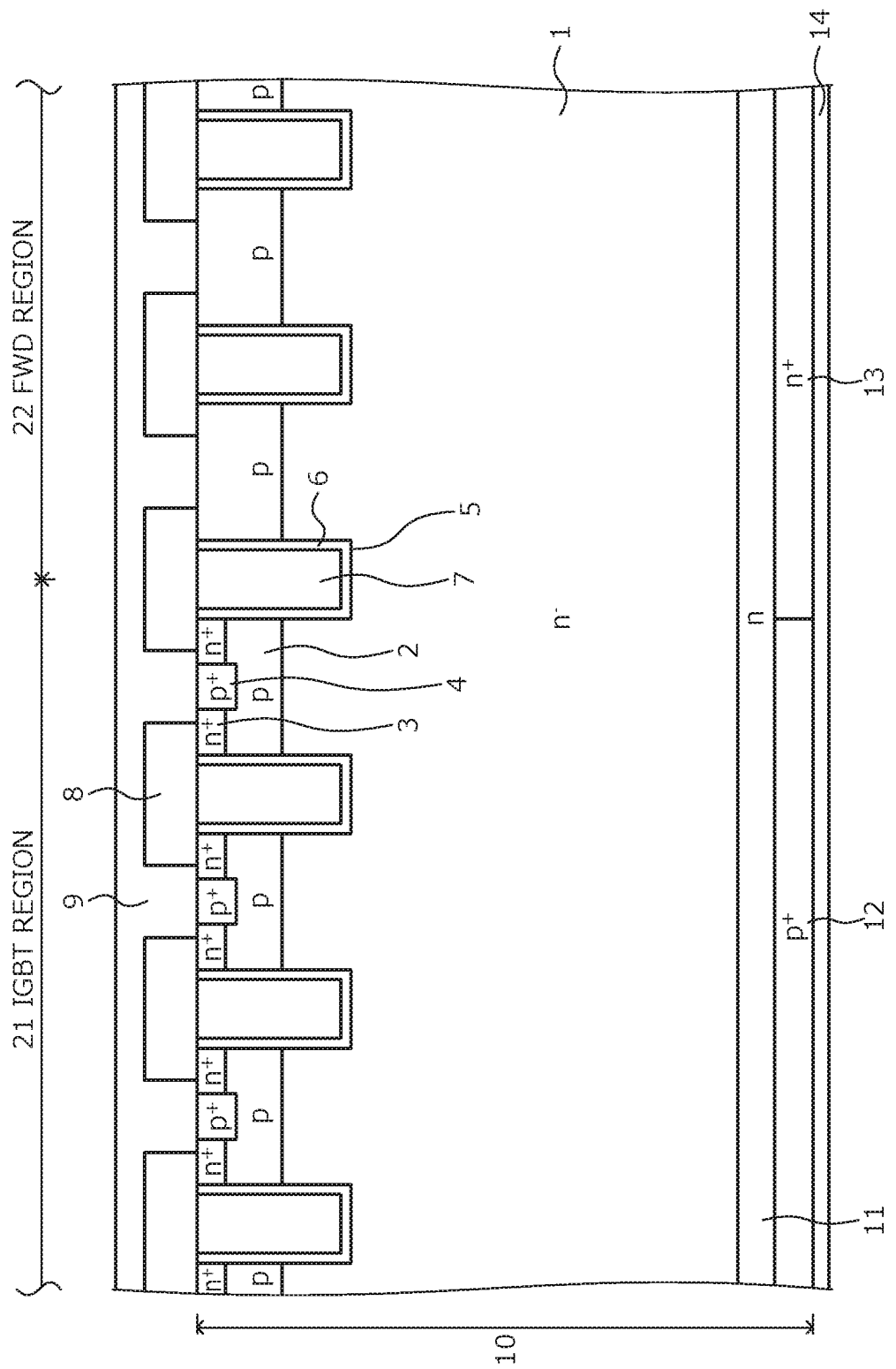
FIG. 1 is a cross-sectional view of an example of a semiconductor device manufactured by a method of manufacturing a semiconductor device according to an embodiment.

First, a structure of an RC-IGBT will be described as an example of a semiconductor device fabricated (manufactured) by the method of manufacturing a semiconductor device according to an embodiment. FIG. 1 is a cross-sectional view of one example of the semiconductor device manufactured by the method of manufacturing the semiconductor device according to the embodiment. The semiconductor device according to the embodiment depicted in FIG. 1 is an RC-IGBT in which a free wheeling diode (FWD) connected in antiparallel to an insulated gate bipolar transistor (IGBT) is disposed on a same n$^-$-type semiconductor substrate (semiconductor chip) 10 as the IGBT.

In particular, an IGBT region 21 and a FWD region 22 are disposed in parallel on the same n$^-$-type semiconductor substrate (semiconductor chip) 10 constituting an n$^-$-type drift region 1. In the IGBT region 21, the IGBT is disposed. In the FWD region 22, the FWD is disposed. In the IGBT region 21, on a front surface side of the n$^-$-type semiconductor substrate 10, a general trench-gate-type MOS gate (insulated gate constituted by a metal, an oxide film, and a semiconductor) is provided and is constituted by a p-type base region 2, an n$^+$-type emitter region 3, a p$^+$-type contact region 4, a trench 5, a gate insulating film 6, and a gate electrode 7.

A front electrode 9 is in contact with the n$^+$-type emitter region 3 and the p$^+$-type contact region 4, and is electrically connected with the n$^+$-type emitter region 3 and the p$^+$-type contact region 4. Further, the front electrode 9 is electrically insulated from the gate electrode 7 by an interlayer insulating film 8. The p-type base region 2, the trench 5, the interlayer insulating film 8, and the front electrode 9 are provided in the IGBT region 21 and the FWD region 22. The n$^+$-type emitter region 3 and the p$^+$-type contact region 4 are not provided in the FWD region 22.

In other words, in the FWD region 22, in a surface layer at a front surface of the n$^-$-type semiconductor substrate 10, similarly to the IGBT region 21, the p-type base region 2, the trench 5, the interlayer insulating film 8, and the front electrode 9 are provided. The p-type base region 2 functions as a p-type anode region in the FWD region 22. The front electrode 9 serves as an emitter electrode and an anode electrode. In FIG. 1, a state is depicted in which in the IGBT region 21, plural IGBT unit cells (constituent unit of an element) are disposed in parallel, and plural FWD unit cells are disposed in the FWD region 22.

In a surface layer at a rear surface of the n$^-$-type semiconductor substrate 10, an n-type field stop (FS) region (first semiconductor region) 11 is provided. The n-type FS region 11 is provided spanning the IGBT region 21 and the FWD region 22. The n-type FS region 11 has a function of suppressing a spreading of a depletion layer that spreads from a pn junction of the p-type base region 2 and the n$^-$-type drift region 1, when the IGBT is OFF. Further, in the surface layer at the rear surface of the n$^-$-type semiconductor substrate 10, at a position shallower than the n-type FS region 11 from the rear surface of the n$^-$-type semiconductor substrate 10, a p$^+$-type collector region (third semiconductor region) 12 and an n$^+$-type cathode region (second semiconductor region) 13 are each selectively provided.

The p$^+$-type collector region 12 is provided in the IGBT region 21, while the n$^+$-type cathode region 13 is provided in the FWD region 22. The p$^+$-type collector region 12 and the n$^+$-type cathode region 13 are in contact with the n-type FS region 11. Further, the p$^+$-type collector region 12 and the n$^+$-type cathode region 13 are in contact with each other and are disposed in parallel along a direction parallel to a main surface of the n$^-$-type semiconductor substrate 10. A part of the n$^-$-type semiconductor substrate 10 excluding the p-type base region 2, the n-type FS region 11, the p$^+$-type collector region 12, and the n$^+$-type cathode region 13 is the n$^-$-type drift region 1.

A rear electrode 14 is provided on the entire rear surface of the n$^-$-type semiconductor substrate 10. The rear electrode 14 is in contact with the p$^+$-type collector region 12 and the n$^+$-type cathode region 13, and is electrically connected to the p$^+$-type collector region 12 and the n$^+$-type cathode region 13. The rear electrode 14 serves as a collector electrode and a cathode electrode.

Figure 3A:
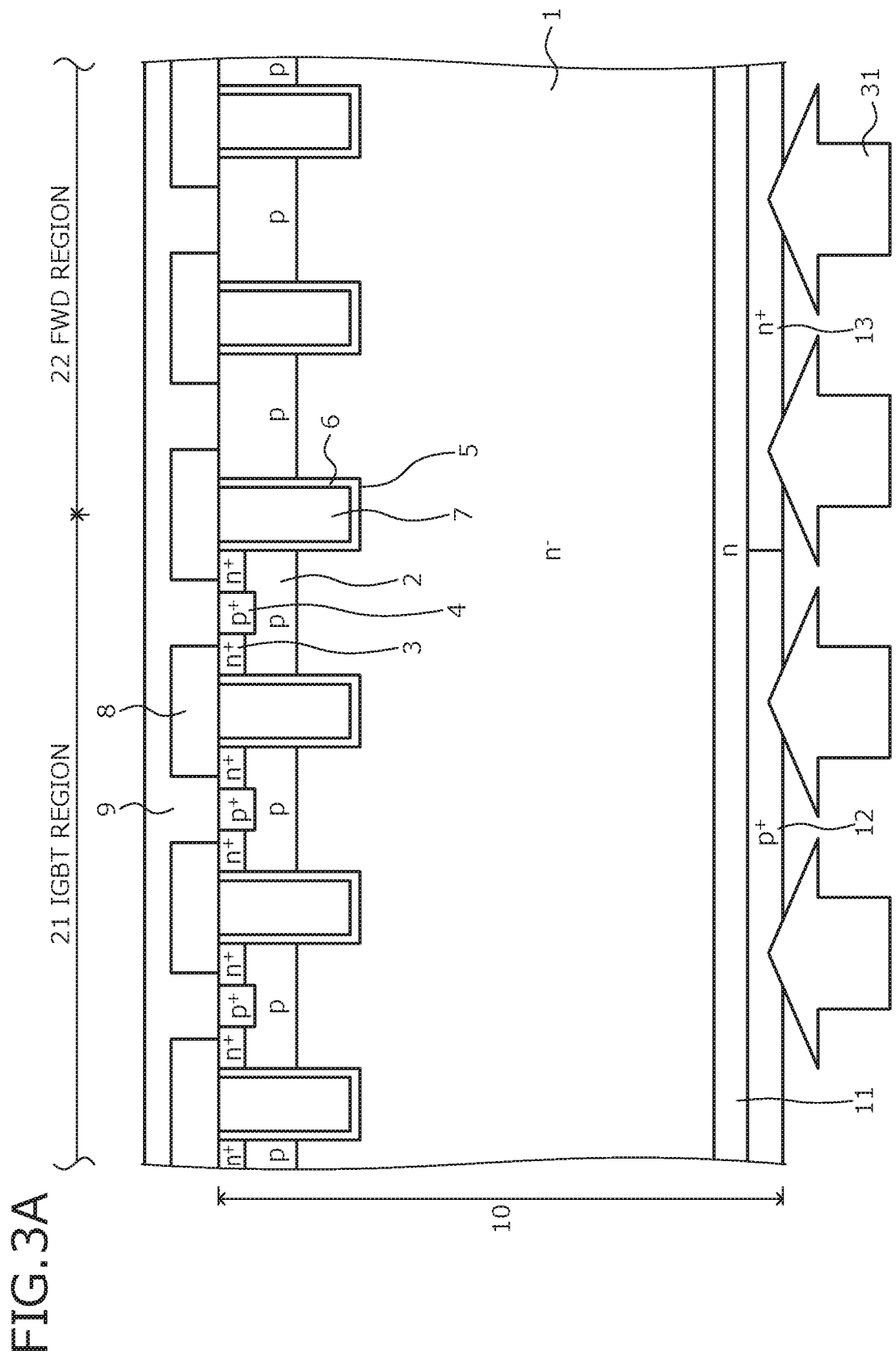
FIG. 3A is a cross-sectional view the semiconductor device according to the embodiment during manufacture.
Figure 4:
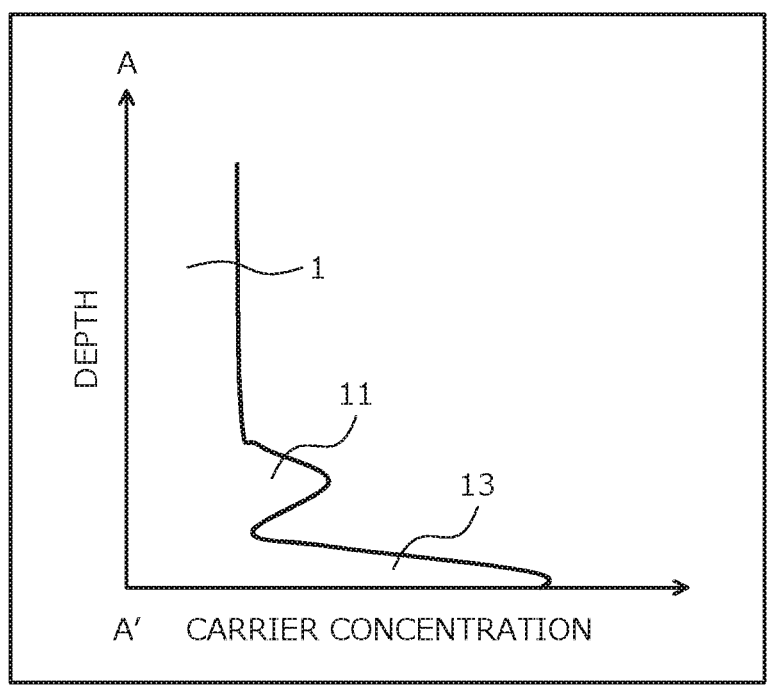
FIG. 4 is a characteristics diagram depicting carrier concentration distribution after laser annealing in the semiconductor device according to the embodiment.

Next, the method of manufacturing the semiconductor device according to the embodiment will be described. FIG. 2 is a flowchart of an outline of the method of manufacturing the semiconductor device according to the embodiment. FIGS. 3A and 3B are cross-sectional views of the semiconductor device according to the embodiment during manufacture. FIG. 4 is a characteristics diagram depicting carrier concentration distribution after laser annealing of the semiconductor device according to the embodiment. In FIG. 4, carrier concentration distribution at cutting line A-A' in FIG. 3B is depicted. First, by a general method, front-surface element structures such as the MOS gate, the interlayer insulating film 8 and the front electrode 9 are formed on the front surface side of the n$^-$-type semiconductor substrate (semiconductor wafer) 10 constituting the n$^-$-type drift region 1 (step S1).

Next, the n$^-$-type semiconductor substrate 10 is made thinner (step S2). A thinning process for the n$^-$-type semiconductor substrate 10 includes the following processes. A surface protective film is formed at the front surface of the n$^-$-type semiconductor substrate 10. The surface protective film, for example, protects the front-surface element structures on the front surface side of the n$^-$-type semiconductor substrate 10 by a resist film (not depicted) formed by an application of resist. Next, at the front surface of the n$^-$-type semiconductor substrate 10, a back-grinding tape (adhesive tape: not depicted) is applied that protects the front surface of the n$^-$-type semiconductor substrate 10 from foreign matter and the like during back-grinding described hereinafter. Next, the back-grinding tape in which unevenness occurs corresponding to unevenness of the front-surface element structures of the n⁻-type semiconductor substrate 10, is planarized. Next, the entire rear surface of the n⁻-type semiconductor substrate 10 is ground (back-grinding) from a rear surface side, making a thickness of the n⁻-type semiconductor substrate 10 uniform.

Next, only a center part of the n⁻-type semiconductor substrate 10 is ground from the rear surface side (for example, a so-called TAIKO (registered trademark) process), and without changing the thickness of a periphery of the n⁻-type semiconductor substrate 10, only the center part of the n⁻-type semiconductor substrate 10 is made to be a product thickness used for the semiconductor device. Next, the back-grinding tape is peeled from the front surface of the n⁻-type semiconductor substrate 10. In place of using a resist film as a protective film, the front surface of the n⁻-type semiconductor substrate 10 may be protected by a protective tape. Further, in place of the TAIKO process, a wafer support system (WSS) process of reducing the thickness of the n⁻-type semiconductor substrate 10 overall while the n⁻-type semiconductor substrate 10 is reinforced by a supporting substrate, may be used.

Next, after the back-grinding, a damaged layer remaining at the rear surface of the n⁻-type semiconductor substrate 10 is removed by etching using a chemical solution. Next, the rear surface of the n⁻-type semiconductor substrate 10 is cleaned using a SC-1 solution (a mixed solution of $NH_4OH$, $H_2O_2$, and $H_2O$), or the like. The thinning process of the n⁻-type semiconductor substrate 10 at step S2 is not limited to the process described above provided that the n⁻-type semiconductor substrate 10 may be made thinner to have a predetermined thickness by adjusting the thickness from the rear surface side.

Next, for example, an n-type impurity such as phosphorus (P) is ion implanted in the entire rear surface of the n⁻-type semiconductor substrate 10, forming the n-type FS region 11 (step S3). The ion implantation for forming the n-type FS region 11 may have a dose amount, for example, from about $5 \times 10^{11}/cm^2$ to $1 \times 10^{14}/cm^2$ and acceleration energy, for example, from about 0.6 MeV to 3 MeV.

Next, for example, a p-type impurity such as boron (B) is ion implanted into the entire rear surface of the n⁻-type semiconductor substrate 10, forming the p⁺-type collector region 12 in a region that is shallower from the rear surface of the n⁻-type semiconductor substrate 10 than is the n-type FS region 11 (step S4). The ion implantation for forming the p⁺-type collector region 12 may have a dose amount, for example, from about $1 \times 10^{12}/cm^2$ to $1 \times 10^{15}/cm^2$ and acceleration energy, for example, from about 5 keV to 50 keV. Next, at the rear surface of the n⁻-type semiconductor substrate 10, a mask, for example, a resist mask (not depicted), having an open part that corresponds to a formation region of the n⁺-type cathode region 13 is formed (step S5).

Next, for example, an n-type impurity such as phosphorus is ion implanted into the rear surface of the n⁻-type semiconductor substrate 10, using the resist mask as a mask; and a part of the p⁺-type collector region 12 exposed at an opening in the resist mask is inverted to the n-type, forming the n⁺-type cathode region 13 (step S6). The ion implantation for forming the n⁺-type cathode region 13 may have a dose amount, for example, from about $1 \times 10^{14}/cm^2$ to $1 \times 10^{16}/cm^2$ and acceleration energy, for example, from about 5 keV to 150 keV. The ion implantation for forming the n⁺-type cathode region 13 is performed at a high dose amount, whereby crystallinity of the surface layer at the rear surface of the n⁻-type semiconductor substrate 10 collapses due to the ion implantation, becoming amorphous.

The ion implantation for forming the n-type FS region 11 suffices to be performed before laser annealing that uses a long-wavelength laser (long-wavelength laser oscillator) described hereinafter. The ion implantations for forming the p⁺-type collector region 12 and the n⁺-type cathode region 13 suffice to be performed before laser annealing that uses a short-wavelength laser (short-wavelength laser oscillator) described hereinafter. Further, the ion implantation for forming the p⁺-type collector region 12 may be performed selectively for only a part that corresponds to a formation region of the p⁺-type collector region 12. Next, the mask used in the formation of the n⁺-type cathode region 13 is removed (step S7). For example, when the mask formed in the process at step S5 is the resist mask, an ashing process is performed.

Next, as depicted in FIG. 3A, a laser light 31 of the short-wavelength laser is irradiated on the entire rear surface of the n⁻-type semiconductor substrate 10, from the rear surface of the n⁻-type semiconductor substrate 10; and the p⁺-type collector region 12 and the n⁺-type cathode region 13, for example, are activated at a temperature of 1000 degrees C. or higher (laser annealing: step S8). By the irradiation of the laser light 31 of the short-wavelength laser onto the rear surface of the n⁻-type semiconductor substrate 10, the amorphous part (the surface layer at the rear surface of the n⁻-type semiconductor substrate 10) that results from the ion implantation for forming the p⁺-type collector region 12 and the n⁺-type cathode region 13, is melted and solidified, and thereby recrystallized. Energy of the laser light 31 of the short-wavelength laser, for example, is from about 1 $J/cm^2$ to 2 $J/cm^2$.

The short-wavelength laser suffices to be second harmonic generation from about 500 nm to 550 nm obtained by a laser oscillator configured to emit the laser light 31, for example, from about 1000 nm to 1100 nm. In particular, the short-wavelength laser, for example, is a YAG or YLF second harmonic generation (Green) laser.

A green laser such as an YLF second harmonic generation may be used as the short-wavelength laser. A green laser is a laser oscillator configured to emit laser of the wavelength range of green. A wavelength of green laser, for example, is from about 500 nm 550 nm and, for example, may be 532 nm or 527 nm generally used in an annealing process.

A depth of impurity activation by the short-wavelength laser, for example, may be about equal to a range of the ion implantation for forming the p⁺-type collector region 12 or the n⁺-type cathode region 13. In particular, the depth of impurity activation by the short-wavelength laser, for example, is less than 1 μm. Therefore, a pulse width of the short-wavelength laser, for example, may be from about 50 ns to 300 ns, and may be from about 100 ns 200 ns. Further, the depth of impurity activation indicates a peak position (position where the impurity concentration is highest) of impurity concentration distribution when an impurity ion-implanted to form the p⁺-type collector region 12 or the n⁺-type cathode region 13 is activated by heat treatment. The depth of impurity activation indicates the depth from the rear surface of the n⁻-type semiconductor substrate 10.

Next, as depicted in FIG. 3B, a laser light 32 of the long-wavelength laser is irradiated on the entire rear surface of the n⁻-type semiconductor substrate 10, from the rear surface of the n⁻-type semiconductor substrate 10, activating the n-type FS region 11 (laser annealing: step S9). A depth of impurity activation by the long-wavelength laser, for example, may be about equal to a range of the ion implantation for forming the n-type FS region 11.

In particular, the depth of impurity activation by the long-wavelength laser, for example, is about 1 µm to 4 µm, and may be from about 1.0 µm 2.5 µm. Therefore, irradiation of the laser light 32 of the long-wavelength laser onto the rear surface of the n⁻-type semiconductor substrate 10 for a period longer than that during the process at step S8 is important. Therefore, a pulse width of the long-wavelength laser, for example, may be set to be about 10 µs or more.

The long-wavelength laser is a laser oscillator configured to emit the laser light 32 of a wavelength range (for example, about 800 nm) of infrared. Preferably, the wavelength of the laser light 32 of the long-wavelength laser, for example, may be 1100 nm or less. The wavelength of the laser light 32 of the long-wavelength laser is a typical wavelength of a laser oscillator having the infrared wavelength range. In particular, the long-wavelength laser, for example, is an infrared (IR) laser such as a gas laser (for example, a carbon dioxide ($CO_2$) laser), a YAG laser, or a semiconductor laser.

A semiconductor laser (wavelength: 808 nm) may be used as the long-wavelength laser. A reason for this is that a condition such as a desired pulse width may be easily set. In this manner, after the process at step S8, the process at step S9 is performed, whereby the n-type FS region 11 is activated by a predetermined temperature (for example, 1000 degrees C. or higher), enabling the carrier concentration of the n-type FS region 11 to be set to a predetermined carrier concentration that is higher than the carrier concentration of the n⁻-type drift region 1 (refer to FIG. 4).

A reason the annealing temperature in the process at step S9 may be set to a predetermined temperature is as follows. As described above, the surface layer at the rear surface of the n⁻-type semiconductor substrate 10 is recrystallized in the process at step S8 and substantially no amorphous part exists. Therefore, during the subsequent process at step S9, decreases of the absorption rate of the laser light 32 of the long-wavelength laser and increases of reflection rate are suppressed. As a result, heat generated by the irradiation of the laser light 32 of the long-wavelength laser is easily transmitted to a region deep from the rear surface of the n⁻-type semiconductor substrate 10. As a result, the carrier concentration of the n-type FS region 11 may be set to be the predetermined carrier concentration, spanning the IGBT region 21 and the FWD region 22. Further, the long-wavelength laser may be used by lower energy (for example, from about 4 J/cm² to 8 J/cm²) than that in a conventional method having the same conditions excluding the sequence of laser irradiation by the short-wavelength laser and the long-wavelength laser. Therefore, the problems arising as a consequence of irradiating the laser light 32 of the long-wavelength laser by high energy are suppressed to a greater extent than in the convention method.

Next, the surface protective film protecting the front surface of the n⁻-type semiconductor substrate 10 is removed (step S10). Next, by sputtering, the rear electrode 14 is formed on the entire rear surface of the n⁻-type semiconductor substrate 10 (step S11). Thereafter, the semiconductor wafer is diced (cut) into individual chips, whereby the RC-IGBT depicted in FIG. 1 is completed.

As described, according to the embodiment, after a region that is shallow from the rear surface of the semiconductor substrate and that has a relatively high impurity concentration (collector region and cathode region) is activated by laser annealing using the short-wavelength laser, a region (FS region) that is deep from the rear surface of the semiconductor substrate is activated by laser annealing using the long-wavelength laser. As a result, first, an amorphous part caused by the ion implantation for forming the region shallow from the rear surface of the semiconductor substrate is melted and recrystallized by the laser annealing using the short-wavelength laser. Therefore, subsequently, during the laser annealing using the long-wavelength laser from the rear surface of the semiconductor substrate, decreases in the absorption rate of the laser light of the long-wavelength laser and increases in the reflection rate may be suppressed. As a result, the heat generated by the laser light of the long-wavelength laser is transmitted to a region deep from the rear surface of the semiconductor substrate, and the temperature in the deep region reaches a predetermined annealing temperature that is necessary for activation. Therefore, the laser annealing using the long-wavelength laser may be performed by lower energy than conventionally. Thus, adverse effects of the components on the front surface side of the semiconductor substrate caused by the laser annealing using the long-wavelength laser may be suppressed.

Further, in particular, the ion implantation for forming the cathode region of the FWD is performed at a high dose amount and therefore, an amorphous state easily advances in the surface layer at the rear surface of the semiconductor substrate in the FWD region. Therefore, in the conventional method, as compared to the FS region in the IGBT region, the FS region in the FWD region is more difficult to active and therefore, the laser annealing using the long-wavelength laser has to be performed by high energy. In contrast, according to the embodiment, as described, due to the laser annealing using the short-wavelength laser, the surface layer at the rear surface of the semiconductor substrate is recrystallized and amorphous parts are substantially eliminated and thereafter, the laser annealing using the long-wavelength laser is performed. Therefore, the FS region in the FWD region may also be assuredly activated.

Further, when the laser light of the long-wavelength laser is irradiated by high energy, the surface state of the rear surface of the semiconductor substrate degrades due to surface roughness of the laser irradiated surface. However, according to the embodiment, the laser light of the long-wavelength laser may be irradiated by lower energy than conventionally, enabling suppression of surface roughness of the surface irradiated with the laser light of the long-wavelength laser. Further, according to the embodiment, defects remaining undetected by spreading resistance (SR), etc. in the semiconductor substrate may be restored by the heat transmitted to regions deep from the rear surface of the semiconductor substrate by the laser light of the long-wavelength laser. Further, according to the embodiment, the laser annealing by the short-wavelength laser and the laser annealing by the long-wavelength laser are performed at different timings and periods of execution of the laser annealing by the short-wavelength laser and the laser annealing by the long-wavelength laser do not overlap. Therefore, for example, the heat of the semiconductor substrate due to laser annealing may be suppressed to a greater extent than in the conventional method in which the execution periods of laser annealing overlap like in Japanese Laid-Open Patent Publication Nos. 2014-036110 and 2009-176892.

Figure 5:
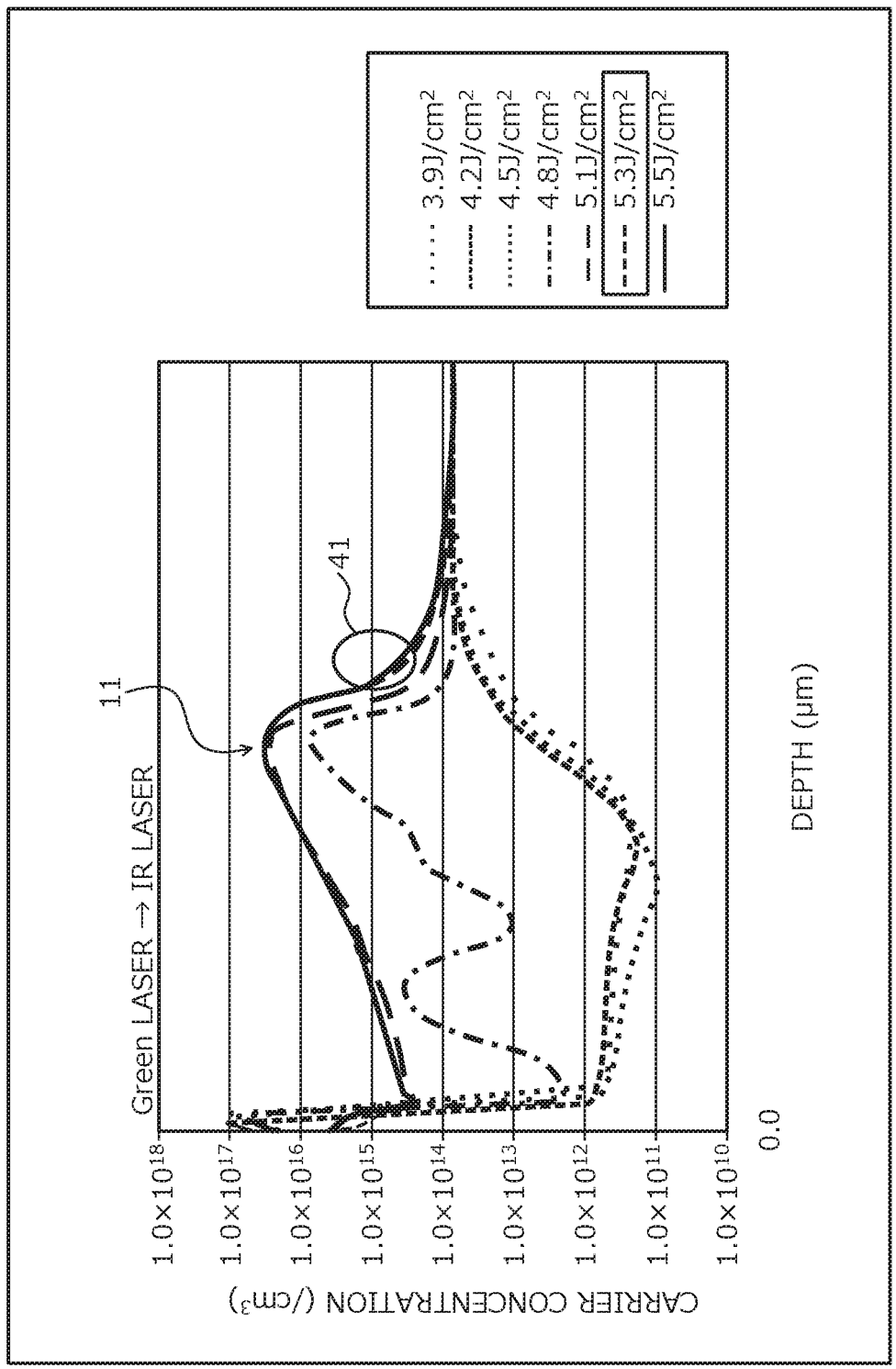
FIG. 5 is a characteristics diagram depicting carrier concentration distribution after laser annealing in EXAMPLE.
Figure 6:
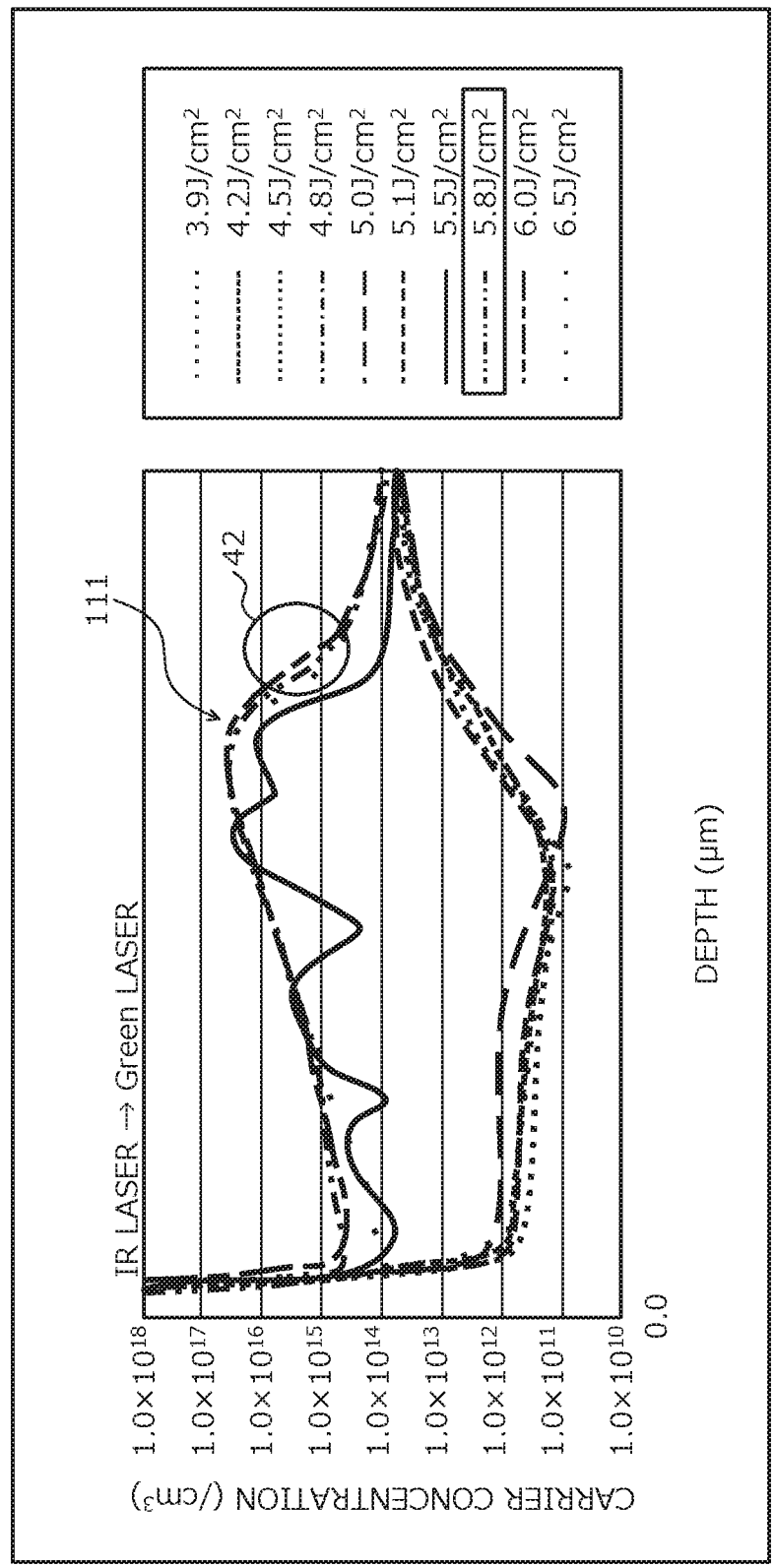
FIG. 6 is a characteristics diagram depicting carrier concentration distribution after laser annealing in a conventional example.

Next, energy value of the laser light 32 of the long-wavelength laser was verified. FIG. 5 is a characteristics diagram depicting carrier concentration distribution after laser annealing in EXAMPLE. In FIG. 5, carrier concentration distribution at cutting line A-A' in FIG. 3B is depicted. In FIG. 5, a horizontal axis indicates depth from the rear surface of the n⁻-type semiconductor substrate 10 (depth=0 µm), while a vertical axis represents n-type carrier concentration (similarly in FIGS. 6 and 7). FIG. 6 is a characteristics diagram depicting carrier concentration distribution after laser annealing in a conventional example. In FIG. 6, carrier concentration distribution at cutting line AA-AA' in FIG. 10B is depicted.

Carrier concentration distribution on the rear surface side of the n⁻-type semiconductor substrate 10 of a RC-IGBT (hereinafter, EXAMPLE) fabricated according to the described method of manufacturing the semiconductor device according to the embodiment (refer to FIGS. 2, 3A, and 3B) is depicted in FIG. 5. In other words, in EXAMPLE, in a sequence of the short-wavelength laser and the long-wavelength laser, the laser lights 31, 32 were sequentially irradiated, whereby laser annealing on the rear surface side of the n⁻-type semiconductor substrate 10 was performed. Plural samples depicted in FIG. 5 had differing energy values of the laser light 32 of the long-wavelength laser, respectively.

For comparison, carrier concentration distribution on the rear surface side of the n⁻-type semiconductor substrate 110 of a RC-IGBT (hereinafter, the conventional example) fabricated according to the conventional method of manufacturing a semiconductor device (refer to FIGS. 10A and 10B) under the same conditions as for EXAMPLE is depicted in FIG. 6. In other words, in the conventional example, in a sequence of the long-wavelength laser and the short-wavelength laser, the laser lights 131, 132 were sequentially irradiated, whereby laser annealing on the rear surface side of the n⁻-type semiconductor substrate 110 was performed. Plural samples depicted in FIG. 6 had differing energy values of the laser light 131 of the long-wavelength laser, respectively.

Further, conditions of EXAMPLE and the conventional example are the same, excluding the irradiation sequence of the laser light of the lasers having differing wavelengths and used in the laser annealing. In particular, the ion implantations for forming the n-type FS regions 11, 111 had a dose amount of $1.0 \times 10^{12}/cm^2$ and acceleration energy of 2.0 MeV. The ion implantations for forming the p⁺-type collector regions 12, 112 had a dose amount of $1.0 \times 10^{13}/cm^2$ and acceleration energy, for example, of 20 keV. The ion implantation for forming the n⁺-type cathode regions 13, 113 has a dose amount, for example, of $3 \times 10^{15}/cm^2$ and acceleration energy of 30 keV. An IR laser was used as the long-wavelength laser and a green laser was used as the short-wavelength laser. Energy of the laser light of the green laser was 1 $J/cm^2$. Laser repetition frequency of the IR laser and of the green laser was 3 kHz or less. The pulse width of the IR laser was 20 μsec. Further, the laser overlap rate was long axis 50%, short axis 50% for the IR laser and for the green laser. The overlap rate need not be particularly specified. In the laser annealing by the IR laser and by the green laser, laser annealing equipment of Sumitomo Heavy Industries (registered trademark) was used.

From the results depicted in FIG. 5, in EXAMPLE, for a device having an Si thickness (thickness of the n⁻-type semiconductor substrate 10) of 120 μm, it was confirmed by a sample for which energy of the laser light of the IR laser was 5.3 $J/cm^2$ or greater (carrier concentration distribution indicated by reference numeral 41), that the n-type FS region 11 was activated. On the other hand, in the conventional example, it was confirmed by a sample for which energy of the laser light of the IR laser was high energy at 5.8 $J/cm^2$ or greater (carrier concentration distribution indicated by reference numeral 42), that the n-type FS region 111 was activated; and it was confirmed that when the energy of the laser light of the IR laser was low energy, the n-type FS region 111 was not completely activated. In other words, it was confirmed that EXAMPLE enabled the energy of the laser light 32 of the long-wavelength laser to be reduced about 0.5 $J/cm^2$ compared to the conventional example for which conditions other than the energy value of the laser light 131 of the long-wavelength laser were the same as those for EXAMPLE.

In FIGS. 5 and 6, while there is non-depicted data in the preferred range (from about 4 $J/cm^2$ 8 $J/cm^2$) for the energy of the laser light 32 of the long-wavelength laser of the present invention, the inventor confirmed that the present invention, when ion implantation conditions and/or laser annealing conditions are changed, within a preferred range for the energy of the laser light 32 of the long-wavelength laser, the n-type FS region 11 is activated and compared to the conventional example of the same conditions, the energy of the laser light 32 of the long-wavelength laser could be reduced. In particular, the present invention, independent of the conditions excluding the energy value of the laser light 32 of the long-wavelength laser, the energy of the laser light 32 of the long-wavelength laser may be reduced about 9% ($\approx (1-5.3\ [J/cm^2]/5.8\ [J/cm^2]) \times 100\%$) as compared to the conventional example. Further, in EXAMPLE, while the Si thickness of the device is set to be 120 μm, even with a different Si thickness, when a different energy density [$J/cm^2$] corresponding to the Si thickness is used, similar effects are obtained.

Figure 7:
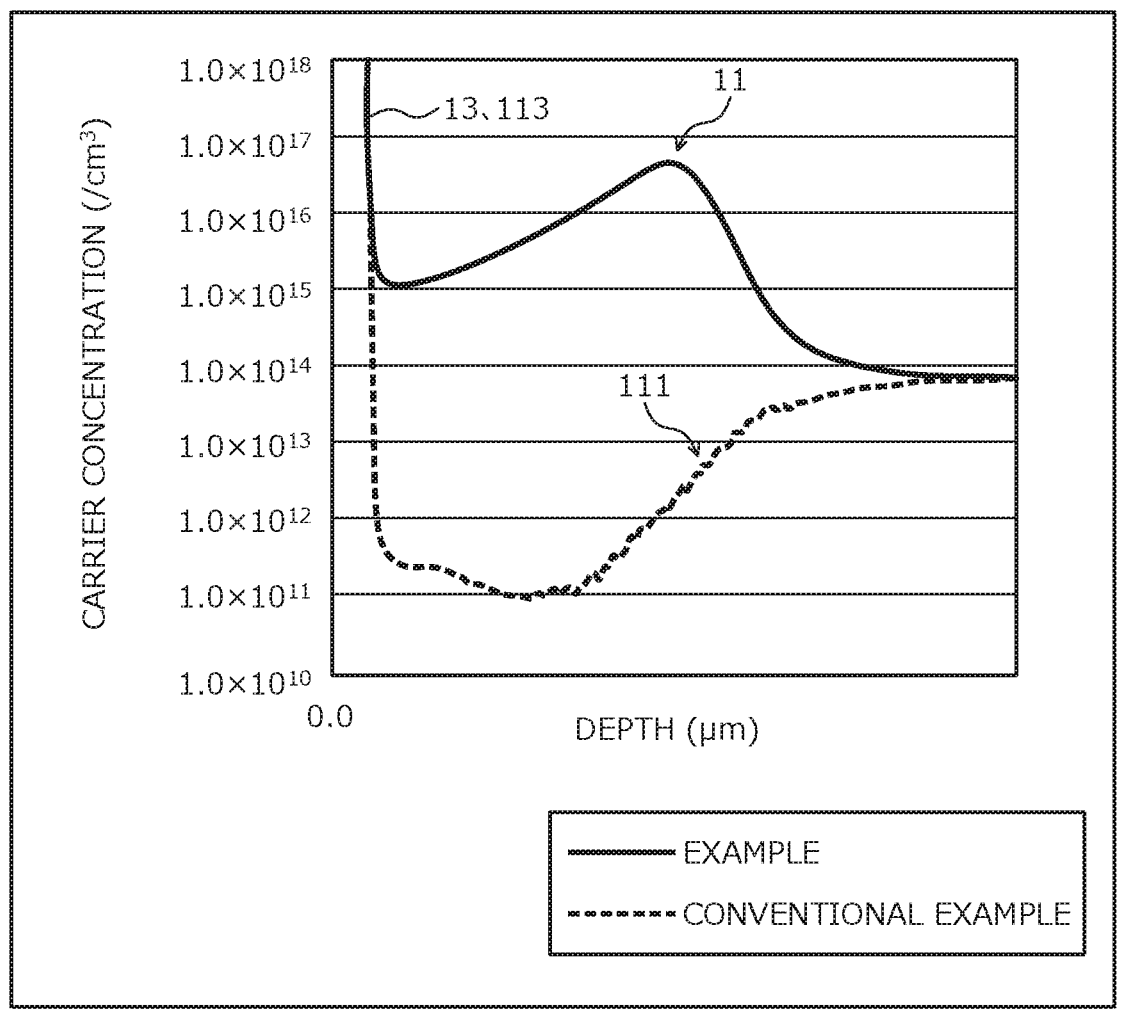
FIG. 7 is a characteristics diagram comparing carrier concentration distribution after laser annealing in EXAMPLE and the conventional example.

In EXAMPLE described and a comparison example, the carrier concentration distribution when the energy of the laser lights 32, 131 of the long-wavelength laser was 5.3 $J/cm^2$ is depicted in FIG. 7. FIG. 7 is a characteristics diagram comparing the carrier concentration distribution after laser annealing in EXAMPLE and the conventional example. From the results depicted in FIG. 7, it was confirmed that when the energy of the laser lights 32, 131 of the long-wavelength laser was 5.3 $J/cm^2$, in the conventional example, the energy of the laser light 131 of the long-wavelength laser was too weak, and the n-type FS region 111 (in particular, the n-type FS region 111 in the FWD region 122) was not completely activated. On the other hand, in EXAMPLE, it was confirmed that even when the laser light 32 of the long-wavelength laser was weak, the n-type FS region 11 was activated.

The present invention is not limited to the embodiment described above and various modifications within a range not departing from the spirit of the invention are possible. For example, in the embodiment described above, while an RC-IGBT is described as an example, application is possible to semiconductor devices that have various structures and in which regions are disposed at differing depths from the same main surface of the semiconductor substrate (semiconductor chip). In particular, for example, the present invention is applicable to a semiconductor device having a structure in which only a FWD having an FS region is disposed in the semiconductor substrate, or a semiconductor device having a structure that includes a FWD having an FS region in one or more of plural semiconductor elements constituting a circuit region. Further, the present invention is similarly implemented when conductivity types (n-type, p-type) are reversed.

According to the invention described above, a part that is amorphous due to ion implantation for forming the second semiconductor region that is shallow from the rear surface of the semiconductor substrate and that has a relatively high impurity concentration, is melted and recrystallized by laser annealing by a short-wavelength laser. Therefore, subsequently, during the laser annealing of the first semiconductor region by a long-wavelength laser from the rear surface of the semiconductor substrate, decreases in the absorption rate and increases in the reflection rate of the laser light of the long-wavelength laser may be suppressed.

The method of manufacturing the semiconductor device according to the present invention achieves an effect in that a predetermined region may be activated by laser annealing by lower energy.

As described, the method of manufacturing the semiconductor device according to the present invention is useful in semiconductor devices fabricated by activating, by laser annealing, a region formed by ion implantation, and is particularly suitable for RC-IGBTs having an FS region at a position deeper from the rear surface of the semiconductor substrate than are the collector region and the cathode region.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, the method comprising:
    ion implanting an impurity in a first semiconductor region of a semiconductor substrate, from one main surface of the semiconductor substrate;
    ion implanting an impurity in a second semiconductor region of the semiconductor substrate shallower than the first semiconductor region, from the one main surface of the semiconductor substrate, the second semiconductor region having an impurity concentration higher than an impurity concentration of the first semiconductor region;
    irradiating first laser light having an energy in a range of 1 J/cm$^2$ to 2 J/cm$^2$ from the one main surface of the semiconductor substrate, thereby activating the second semiconductor region, and melting and recrystallizing a surface layer at the one main surface of the semiconductor substrate; and
    irradiating second laser light having an energy in a range of 4 J/cm$^2$ to 8 J/cm$^2$ from the one main surface of the semiconductor substrate, thereby activating the first semiconductor region, after the recrystallizing a surface layer, the second laser light having a wavelength longer than that of the first laser light.

2. The method according to claim 1, wherein the second semiconductor region has a depth less than 1 μm from the one main surface of the semiconductor substrate.

3. The method according to claim 1, wherein the first semiconductor region has a depth in a range of 1 μm to 4 μm from the one main surface of the semiconductor substrate.

4. The method according to claim 1, wherein a wavelength of the first laser light is in a range of 500 nm to 550 nm.

5. The method according to claim 1, wherein a wavelength of the second laser light is at least 800 nm.

6. A method of manufacturing a semiconductor device, the method comprising:
    ion implanting an impurity in a first semiconductor region of a semiconductor substrate of a first conductivity type, from one main surface of the semiconductor substrate;
    ion implanting an impurity in a second semiconductor region of the semiconductor substrate shallower than the first semiconductor region, from the one main surface of the semiconductor substrate, the second semiconductor region having an impurity concentration higher than an impurity concentration of the first semiconductor region;
    irradiating first laser light having an energy in a range of 1 J/cm$^2$ to 2 J/cm$^2$ from the one main surface of the semiconductor substrate, thereby activating the second semiconductor region, and melting and recrystallizing a surface layer at the one main surface of the semiconductor substrate; and
    irradiating second laser light having an energy in a range of 4 J/cm$^2$ to 8 J/cm$^2$ from the one main surface of the semiconductor substrate, thereby activating the first semiconductor region, after the recrystallizing a surface layer, the second laser light having a wavelength longer than that of the first laser light,
    forming an element structure on another main surface of the semiconductor substrate of the first conductivity type; and
    ion implanting an impurity of a second conductivity type in a third semiconductor region in the semiconductor substrate shallower than the first semiconductor region, from the one main surface of the semiconductor substrate to form the third semiconductor region of the second conductivity type, before said recrystallizing a surface layer, the third semiconductor region being disposed in parallel with the second semiconductor region in a direction parallel to the one main surface of the semiconductor substrate, wherein
    said ion implanting an impurity in a first semiconductor region includes ion implanting an impurity of the first conductivity type from the one main surface of the semiconductor substrate to form the first semiconductor region to be of the first conductivity type,
    said ion implanting an impurity in a second semiconductor region includes ion implanting an impurity of the first conductivity type from the one main surface of the semiconductor substrate to form the second semiconductor region to be of the first conductivity type, and
    said irradiating first laser light includes activating the second semiconductor region and the third semiconductor region by the first laser light.

7. The method according to claim 1, wherein the ion implanting an impurity in a first semiconductor region includes ion implanting in the first semiconductor region a dose in a range of 5×10$^{11}$/cm$^2$ to 1×10$^{14}$/cm$^2$.

8. The method according to claim 1, wherein the ion implanting an impurity in a second semiconductor region includes ion implanting in the second semiconductor region a dose in a range of 1×10$^{14}$/cm$^2$ to 1×10$^{16}$/cm$^2$.

9. The method according to claim 6, wherein the ion implanting an impurity of a second conductivity type in a third semiconductor region includes ion implanting in the third semiconductor region a dose in a range of 1×10$^{12}$/cm$^2$ to 1×10$^{15}$/cm$^2$.

* * * * *